(12) United States Patent
Kwon et al.

(10) Patent No.: US 11,502,154 B2
(45) Date of Patent: Nov. 15, 2022

(54) DISPLAY APPARATUS AND METHOD FOR MANUFACTURING THE SAME

(71) Applicant: LG Display Co., Ltd., Seoul (KR)

(72) Inventors: Hoiyong Kwon, Paju-si (KR); MiReum Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 159 days.

(21) Appl. No.: 16/993,136

(22) Filed: Aug. 13, 2020

(65) Prior Publication Data

US 2020/0373378 A1 Nov. 26, 2020

Related U.S. Application Data

(62) Division of application No. 16/172,259, filed on Oct. 26, 2018, now Pat. No. 10,777,629.

(30) Foreign Application Priority Data

Oct. 31, 2017 (KR) .................. 10-2017-0143765

(51) Int. Cl.
*H01L 27/32* (2006.01)
*H01L 51/56* (2006.01)
(Continued)

(52) U.S. Cl.
CPC ...... *H01L 27/3276* (2013.01); *H01L 27/3246* (2013.01); *H01L 27/3258* (2013.01); *H01L 27/3262* (2013.01); *H01L 27/3272* (2013.01); *H01L 51/003* (2013.01); *H01L 51/0096* (2013.01); *H01L 51/524* (2013.01); *H01L 51/5253* (2013.01); *H01L 51/56* (2013.01)

(58) Field of Classification Search
CPC ... H01L 51/003; H01L 51/56; H01L 51/5253; H01L 51/524; H01L 51/0096; H01L 27/3258; H01L 27/3246; H01L 27/3272; H01L 27/3276; H01L 27/3262; Y02E 10/549; Y02P 70/50
See application file for complete search history.

(56) References Cited

U.S. PATENT DOCUMENTS 9,401,354 B1 * 7/2016 Bae .................. H01L 27/0296
9,736,950 B2 8/2017 Kwon et al.
(Continued)

FOREIGN PATENT DOCUMENTS

CN 102760846 A 10/2012
CN 102856252 A 1/2013
(Continued)

*Primary Examiner* — Vongsavanh Sengdara
(74) *Attorney, Agent, or Firm* — Seed IP Law Group LLP

(57) ABSTRACT

Disclosed are a display apparatus and a method for manufacturing the same. The display apparatus comprises: a multi-buffer layer; a pixel array layer formed on the multi-buffer layer and including a plurality of pixels respectively formed as the intersections of a plurality of gate lines and a plurality of data lines; an encapsulation layer formed on the pixel array layer; and an encapsulation substrate formed on the encapsulation layer and including a display area and a non-display area adjacent to the display area, wherein, the encapsulation substrate is for supporting the display area and the non-display area such that there is no base substrate in the display apparatus.

20 Claims, 9 Drawing Sheets

(51) Int. Cl.
*H01L 51/52* (2006.01)
*H01L 51/00* (2006.01)

(56) References Cited

U.S. PATENT DOCUMENTS

| | | |
|---|---|---|
| 2013/0005059 A1 | 1/2013 | Song et al. |
| 2014/0183478 A1 | 7/2014 | Lee et al. |
| 2014/0367658 A1 | 12/2014 | Kwak |
| 2015/0044442 A1 | 2/2015 | Huang et al. |
| 2015/0060778 A1 | 3/2015 | Kim et al. |
| 2015/0207102 A1* | 7/2015 | Jeong ................ H04M 1/0268 257/40 |
| 2015/0379923 A1* | 12/2015 | Lee .................... H01L 27/3272 345/82 |
| 2016/0064691 A1 | 3/2016 | Lee et al. |
| 2017/0005292 A1 | 1/2017 | Lee et al. |
| 2017/0077213 A1* | 3/2017 | Jo ...................... H01L 51/0097 |
| 2017/0229417 A1* | 8/2017 | Yamaguchi ............. H01L 24/83 |
| 2017/0352834 A1* | 12/2017 | Kim .................... H01L 27/3276 |
| 2018/0151654 A1* | 5/2018 | Lee ..................... H01L 27/3258 |

FOREIGN PATENT DOCUMENTS

| | | |
|---|---|---|
| CN | 104241544 A | 12/2014 |
| CN | 104377165 A | 2/2015 |
| CN | 104425550 A | 3/2015 |
| CN | 104885142 A | 9/2015 |
| CN | 106328671 A | 1/2017 |
| JP | 2010-3668 A | 1/2010 |
| KR | 10-2010-0009910 A | 1/2010 |
| KR | 10-2015-0078504 A | 7/2015 |
| KR | 10-2016-0038959 A | 4/2016 |
| KR | 20160037297 A | 4/2016 |
| KR | 20170015597 A | 2/2017 |
| KR | 20170080298 A | 7/2017 |

* cited by examiner

DISPLAY APPARATUS AND METHOD FOR MANUFACTURING THE SAME

CROSS-REFERENCE TO RELATED APPLICATIONS

This application is a divisional of U.S. patent application Ser. No. 16/172,259 filed Oct. 26, 2018 which claims the benefit of the Korean Patent Application No. 10-2017-0143765 filed on Oct. 31, 2017, which is hereby incorporated by reference as if fully set forth herein.

BACKGROUND

Technical Field

The present disclosure relates to a display apparatus.

Description of the Related Art

Display apparatuses are being widely used as a display screen of notebook computers, tablet computers, smartphones, portable display apparatuses, and portable information devices in addition to a display screen of television (TVs) or monitors.

Liquid crystal display (LCD) apparatuses and organic light emitting display apparatuses display an image by using thin film transistors (TFTs) as switching elements. Since the LCD apparatuses does not self-emit light, the LCD apparatuses display an image by using light emitted from a backlight unit which is disposed under a liquid crystal display panel. Since the LCD apparatuses include the backlight unit, there is a limitation in design, and luminance and a response time are reduced. Since the organic light emitting display apparatuses include an organic material, the organic light emitting display apparatuses are vulnerable to water, causing a reduction in reliability and lifetime.

Recently, research and development on light emitting diode display apparatuses including a micro light emitting device are being done. The light emitting diode display apparatuses have high image quality and high reliability, and thus, are attracting much attention as next-generation display apparatuses.

A related art display apparatus includes a display area, corresponding to an active area of a TFT array substrate, and a non-display area corresponding to an inactive area. The related art display apparatus includes a display panel which is manufactured based on a base substrate (for example, a polyimide substrate) provided on a glass substrate. Also, a polarizing film is provided in the display area, and a pad part is provided in the non-display area.

However, in the related art display apparatus, visibility is deteriorated by the base substrate, reliability is reduced due to particles and the partial detachment of a layer from the base substrate, and the process cost and a process time increase. Also, in the related art display apparatus, since the pad part is not supported by an encapsulation substrate, a crack occurs easily in a laser release process.

BRIEF SUMMARY

The present disclosure provides a display apparatus and a method for manufacturing the same, which can solve the above technical problems in the prior art.

According to the embodiments of the present disclosure, the display apparatus comprises: a multi-buffer layer; a pixel array layer formed on the multi-buffer layer and including a plurality of pixels respectively formed as the intersections of a plurality of gate lines and a plurality of data lines; an encapsulation layer formed on the pixel array layer; and an encapsulation substrate formed on the encapsulation layer and including a display area and a non-display area adjacent to the display area, wherein, the encapsulation substrate is for supporting the display area and the non-display area such that there is no base substrate in the display apparatus.

According to the embodiments of the present disclosure, the method for manufacturing a display apparatus comprises: providing a plurality of sacrificial layers; sequentially stacking a multi-buffer layer, in the form of a plurality of buffer layers, a pixel array layer, an encapsulation layer, and an encapsulation substrate on the plurality of sacrificial layers, the encapsulation substrate including a display area and a non-display area adjacent to the display area; removing the plurality of sacrificial layers in the non-display area through a laser release process; forming hole patterns corresponding to pad parts provided in the multi-buffer layer in the non-display area, to expose the pad parts in a direction opposite to the encapsulation substrate; filling an anisotropic conductive film (ACF) in the hole patterns, the pad parts are connected to circuit films via the ACF; and removing the plurality of sacrificial layers in the display area through a laser release process.

In the display apparatus according to the present embodiment, since the encapsulation substrate simultaneously supports the display area AA and the non-display areas PA1 and PA2 without applying the base substrate (for example, the polyimide substrate) of the display panel, a crack is prevented from occurring in a release process, thereby enhancing visibility and preventing the partial detachment of a layer and penetration of water and particles to enhance reliability.

Moreover, in the display apparatus according to the embodiments of the present disclosure, the display area and the non-display area may be simultaneously supported by the encapsulation substrate without applying the base substrate of the display panel, thereby enhancing visibility and reliability.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
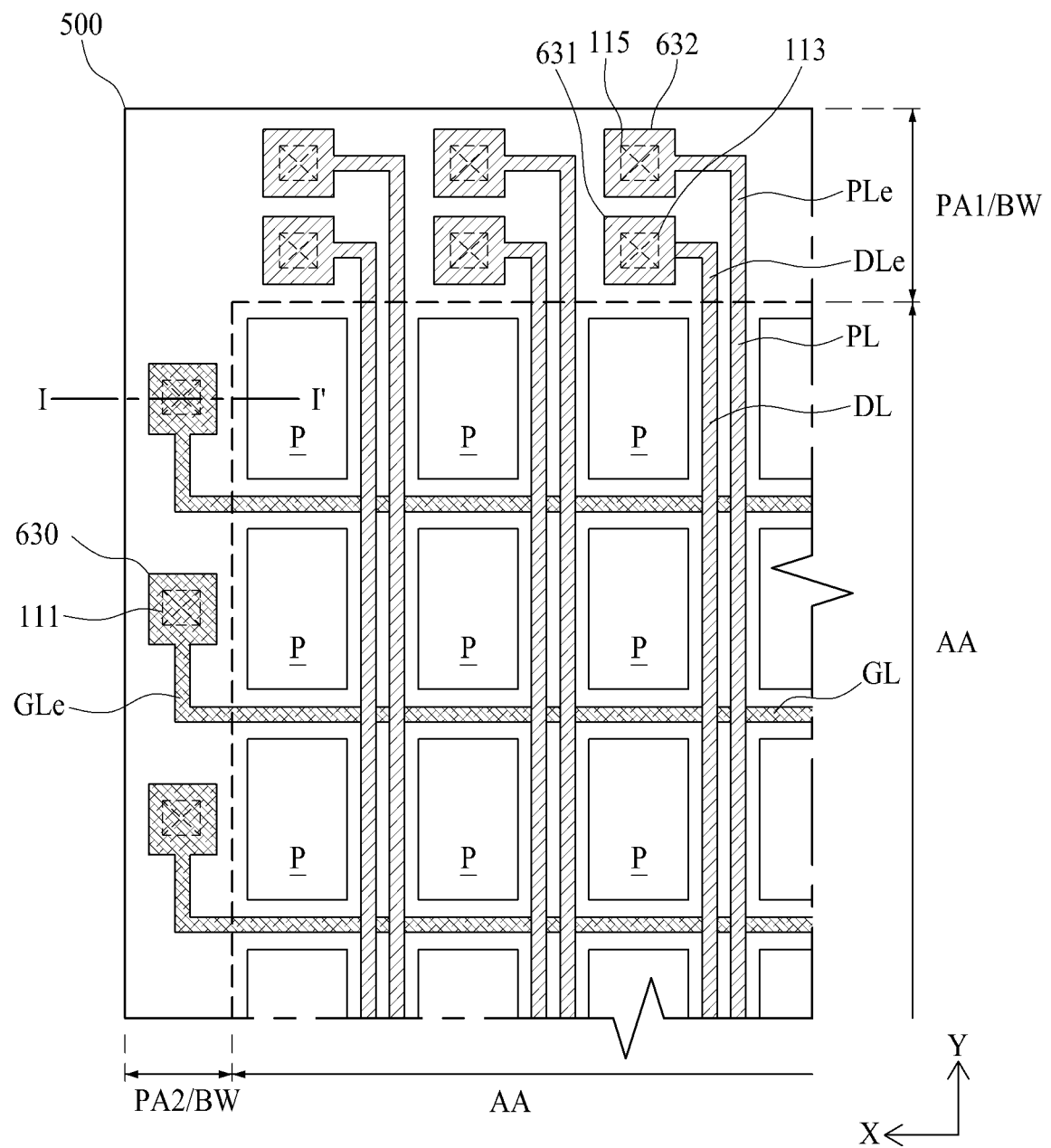
FIG. 1 is a plan view illustrating a display apparatus according to an embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~,' 'over~,' 'under~,' and 'next~,' one or more other parts may be disposed between the two parts unless 'just' or 'direct' is used. In describing a time relationship, for example, when the temporal order is described as 'after~,' 'subsequent~,' 'next~,' and 'before~,' a case which is not continuous may be included unless 'just' or 'direct' is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," etc., may be used. The terms are merely for differentiating one element from another element, and the essence, sequence, order, or number of a corresponding element should not be limited by the terms. It will be understood that when an element or layer is described as being "connected," "coupled," or "adhered" to another element or layer, the element or layer can be directly connected or adhered to the other element or layer, but the other element or layer can be "disposed" between elements or layers, or elements or layers can be "connected," "coupled," or "adhered" to each other through the other element or layer.

Therefore, in the present disclosure, examples of the display apparatus may include a narrow-sense display apparatus itself, such as a liquid crystal module (LCM) or an organic light emitting display (OLED) module, and a set device which is a final consumer device or an application product including the LCM or the OLED module.

For example, when a display panel is an organic light emitting display panel, the display panel may include a plurality of gate lines, a plurality of data lines, and a plurality of pixels respectively provided in a plurality of pixel areas adjacent to the intersections of the gate lines and the data lines. Also, the display panel may include an array substrate including a TFT which is an element for selectively applying a voltage to each of the pixels, an organic light emitting device layer on the array substrate, and an encapsulation substrate disposed on the array substrate to cover the organic light emitting device layer. The encapsulation substrate may protect the TFT and the organic light emitting device layer from an external impact and may prevent water or oxygen from penetrating into the organic light emitting device layer. Also, a layer provided on the array substrate may include an inorganic light emitting layer (for example, a nano-sized material layer, a quantum dot, or the like).

Moreover, the display panel may further include a backing such as a metal plate attached on the display panel. However, the present embodiment is not limited to the metal plate, and the display panel may include another structure.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present disclosure will be described in detail with reference to the accompanying drawings.

FIG. 1 is a plan view illustrating a display apparatus according to an embodiment of the present disclosure.

Referring to FIG. 1, the display apparatus may include a pixel P, a first hole pattern 111, second and third hole patterns 113 and 115, a first pad part 630, second and third pad parts 631 and 632, and an encapsulation substrate 500.

The encapsulation substrate 500 may include a display area AA and a plurality of non-display areas PA1 and PA2. The display area AA may be an area which displays an image, and may be located in a center portion of the encapsulation substrate 500. Here, the display area AA may correspond to an active area of a pixel array layer. For example, the display area AA may include a plurality of pixels P respectively provided in a plurality of pixel areas adjacent to the intersections of a plurality of gate lines GL and a plurality of data lines DL. Here, each of the plurality of pixels P may correspond to a minimum unit area which emits light.

The display area AA of the encapsulation substrate 500 may include the plurality of gate lines GL, the plurality of data lines DL intersecting the plurality of gate lines GL, and a plurality of power supply lines PL parallel to the plurality of data lines DL. Additionally, a plurality of auxiliary power lines may be additionally provided in the display area AA of the encapsulation substrate 500, based on a driving method of each of the pixels P. Each of the pixels P may be provided in a corresponding pixel area of the pixel areas which are adjacent to the gate lines GL and the data lines DL in the display area AA. According to an embodiment, each of the pixels P may include a thin film transistor (TFT), a planarization layer, a filling layer, an organic light emitting device, a bank, and an encapsulation layer.

The encapsulation substrate 500 may support the display area AA and the non-display areas PA1 and PA2. Here, each of the non-display areas PA1 and PA2 may be an area which is adjacent to the display area AA, and may correspond to an area which does not display an image. The non-display areas PA1 and PA2 may include a first non-display area PA1 parallel to a long-side lengthwise direction X of the encapsulation substrate 500 and a second non-display area PA2 parallel to a short-side lengthwise direction Y of the encapsulation substrate 500. For example, each of the first and second non-display areas PA1 and PA2 may be provided to have a width of several hundreds μm or less, for minimizing a bezel width BW of the display apparatus.

The encapsulation substrate 500 may be disposed on the pixel array layer so as to protect the TFT and the organic light emitting device from external water, air, or the like. For example, the encapsulation substrate 500 may be a glass substrate or a plastic substrate.

The first hole pattern 111 may be provided in the second non-display area PA2 of the encapsulation substrate 500. According to an embodiment, the first hole pattern 111 may be provided in the second non-display area PA2 of the encapsulation substrate 500 adjacent to one end of each of the plurality of gate lines GL.

The second and third hole patterns 113 and 115 may be provided in the first non-display area PA1 of the encapsulation substrate 500. According to an embodiment, the second and third hole patterns 113 and 115 may be provided in the first non-display area PA1 of the encapsulation substrate 500 adjacent to one end of each of the plurality of data lines DL.

The first hole pattern 111 and the second and third hole patterns 113 and 115 may be formed through a laser process or a wet etching process. In one embodiment, for example, the hole patterns may be formed through the laser process, for increasing productivity and simplifying the manufacturing process.

The first pad part 630 may be provided in a multi-buffer layer in the form of a plurality of buffer layers, electrically connected to a circuit film through the first hole pattern 111 of a first buffer layer, and individually connected to one end of a corresponding gate line GL through a gate extension line GLe. Here, the gate extension line GLe and the first hole pattern 111 may be provided to extend from the one end of the corresponding gate line GL to the second non-display area PA2.

The second pad part 631 may be provided in the first non-display area PA1 of the encapsulation substrate 500 and may be exposed through the second hole pattern 113. The second pad part 631 may be formed of a metal material, electrically connected to an external circuit through the second hole pattern 113, and individually connected to one end of each of the plurality of data lines DL. Here, the second pad part 631 may be connected to the plurality of data lines DL through a plurality of data extension lines DLe. That is, each of the plurality of data extension lines DLe may be provided to extend from one end of a corresponding data line DL to the first non-display area PA1.

The third pad part 632 may be provided in the first non-display area PA1 of the encapsulation substrate 500 and may be exposed through the third hole pattern 115. The third metal pad 632 may be formed of a metal material, electrically connected to the external circuit through the third hole pattern 115, and individually connected to one end of each of the plurality of power supply lines PL. Here, the third pad part 632 may be connected to the plurality of power supply lines PL through a plurality of power supply extension lines PLe. That is, each of the plurality of power supply extension lines PLe may be provided to extend from one end of a corresponding power supply line PL to the first non-display area PA1.

According to an embodiment, the first pad part 630 and the second and third pad parts 631 and 632 may be formed along with a light shielding layer which includes a metal material and is provided on the multi-buffer layer, for blocking light irradiated onto a semiconductor layer of the TFT.

The structure of the regions where the second and third pad parts 631 and 632 are formed is similar or the same as that of the region where the first pad part 630 is formed.

Figure 2:
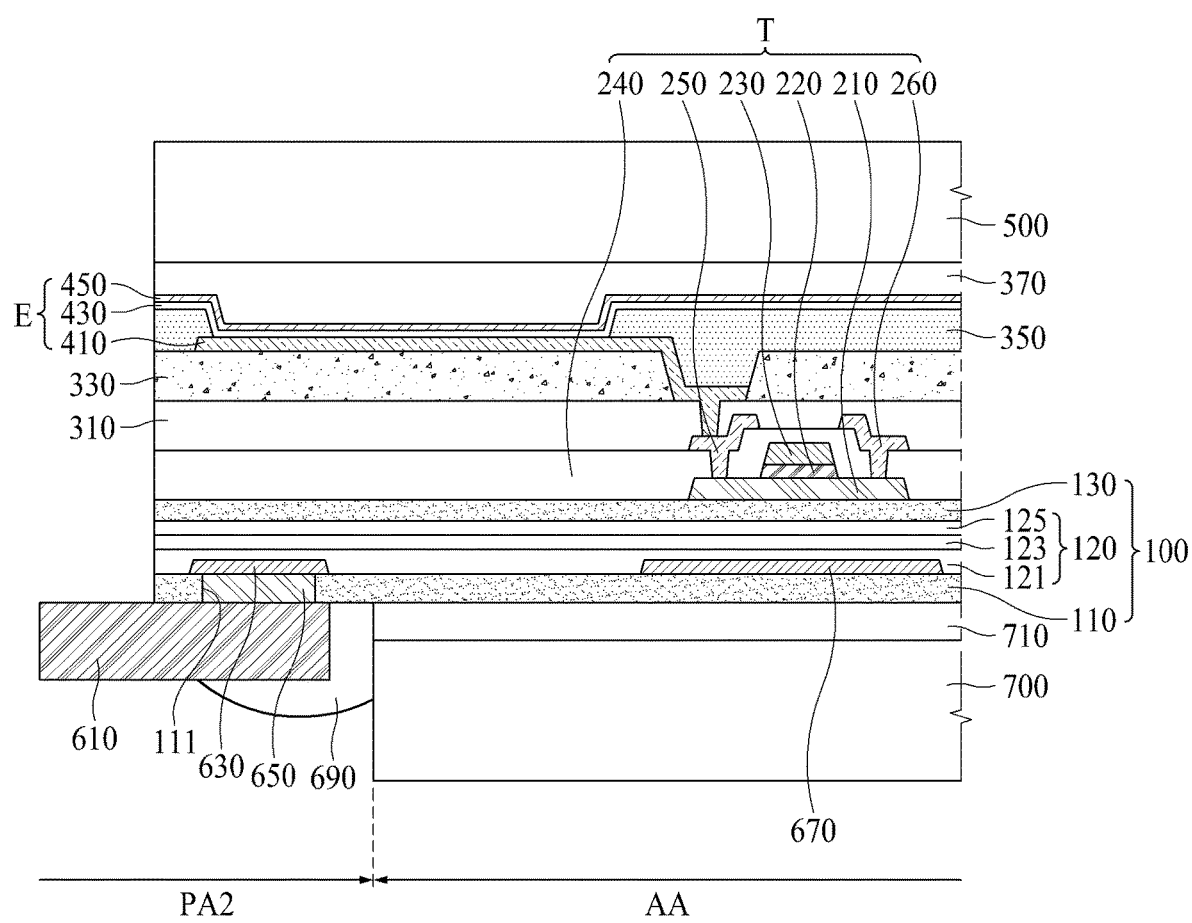
FIG. 2 is a cross-sectional view taken along line I-I' illustrated in FIG. 1, in a display apparatus according to an embodiment of the present disclosure.

FIG. 2 is a cross-sectional view taken along line I-I' illustrated in FIG. 1, in a display apparatus according to an embodiment of the present disclosure.

Referring to FIG. 2, in the display apparatus, an encapsulation substrate 500 may simultaneously support a display area AA and a plurality of non-display areas PA1 and PA2 without applying a base substrate (for example, a polyimide substrate) of a display panel, thereby enhancing visibility and reliability. In detail, a multi-buffer layer or a plurality of buffer layers 100 may be provided on a sacrificial layer. Here, the sacrificial layer may be removed after the multi-buffer layer 100, a pixel array layer (not shown), an encapsulation layer 370, and the encapsulation substrate 500 are sequentially stacked. According to an embodiment, the sacrificial layer may include a carrier glass substrate and a release layer stacked on an upper end of the carrier glass substrate. Here, the release layer may be formed of amorphous silicon (a-Si), silicon nitride (SiNx), and/or the like. Also, the sacrificial layer may be removed through a laser release process after stacking of the multi-buffer layer 100, the pixel array layer, the encapsulation layer 370, and the encapsulation substrate 500 is completed.

The multi-buffer layer 100 may be formed by stacking a plurality of inorganic layers. For example, the multi-buffer layer 100 may include a multilayer where one or more inorganic layers of silicon oxide (SiOx), SiNx, and silicon oxynitride (SiON) are stacked.

In one embodiment, the multi-buffer layer 100 may include a first buffer layer 110, a second buffer layer 120, and a third buffer layer 130.

The first buffer layer 110 may be disposed on a sacrificial layer. The first buffer layer 110 may be a metal buffer layer. For example, the first buffer layer 110 may be formed of silicon dioxide ($SiO_2$). The first buffer layer 110 may be deposited on the sacrificial layer though a sputtering process or an electron beam (e-beam) evaporation process.

According to an embodiment, the first buffer layer 110 may be formed of $SiO_2$, and a release layer of the sacrificial layer may be formed of a-Si or SiNx, whereby the first buffer layer 110 may be separated from the sacrificial layer through a laser release process. In detail, in the display apparatus according to the present disclosure, since the base substrate (for example, the polyimide substrate) is not applied, the first buffer layer 110 provided in a lowermost portion of the multi-buffer layer 100 may directly contact the sacrificial layer. Therefore, the reliability of the laser release process may be determined based on a material of each of the first buffer layer 110 and the sacrificial layer. That is, since the release layer of the sacrificial layer is formed of a-Si or SiNx, the release layer of the sacrificial layer may be easily separated from the first buffer layer 110. Therefore, in the display apparatus according to the present disclosure, since the first buffer layer 110 is formed of $SiO_2$ and the release layer of the sacrificial layer is formed of a-Si or SiNx, the sacrificial layer may be removed through the laser release process even without applying the base substrate.

The first buffer layer 110 may include a first hole pattern 111 which is provided in an area overlapping a first pad part 630. The first hole pattern 111 may be provided in the non-display area PA2 of the first buffer layer 110, for exposing the first pad part 630 in a direction opposite to the encapsulation substrate 500. That is, through the laser process, for example, the first hole pattern 111 may be formed by etching or carving out a portion of the first buffer layer 110 thereby exposing the first pad part 630. Thereafter, the first hole pattern 111 may be filled with an anisotropic conductive film (ACF) 650 which attaches a circuit film 610 on the first pad part 630. Therefore, the circuit film 610 may face the first pad part 630 with the first hole pattern 111 therebetween and may be electrically connected to the first pad part 630 by the ACF 650 buried in the first hole pattern 111.

The first pad part 630 may overlap the first hole pattern 111 which is provided in the non-display area PA2 on the first buffer layer 110. The first pad part 630 may be disposed in an edge region of the encapsulation layer 500. For example, metal may be deposited on the first buffer layer 110, and then, may be exposed and patterned, thereby forming the first pad part 630. Since the first pad part 630 is formed by exposing and patterning the deposited metal, the first pad part 630 may be more precisely formed than a light shielding pattern or a black matrix which is formed through a bezel printing process.

According to an embodiment, the first pad part 630 and a light shielding layer 670 may be disposed on the same layer and may be spaced apart from each other. In detail, the first pad part 630 may be provided in the non-display area PA2 on the first buffer layer 110, and simultaneously, the light shielding layer 670 may be provided in an area overlapping a semiconductor layer 210 of a TFT T, on the first buffer layer 110. Therefore, the first pad part 630 and the light shielding layer 670 may be simultaneously provided in the non-display area PA2 on the first buffer layer 110 and in an area overlapping the semiconductor layer 210. As a result, in a related art display apparatus, a light shielding layer corresponding to a TFT and a black matrix corresponding to a bezel area may be formed through separate processes. On the other hand, in the display apparatus according to the present disclosure, the first pad part 630 provided in the non-display area PA2 and the light shielding layer 670 overlapping the semiconductor layer 210 may be simultaneously formed through a one-time patterning process, thereby reducing the process cost and a process time, enhancing reliability, and forming a precise light shielding pattern. As described above, in the display apparatus according to the present disclosure, since the precise light shielding pattern is formed, light leakage is prevented, and visibility is not reduced.

According to an embodiment, the first pad part 630 may be formed of metal, such as molybdenum (Mo), aluminum (Al), chromium (Cr), or silver (Ag), or an alloy thereof, but is not limited thereto. In other embodiments, the first pad part 630 may be formed of various materials well known to those skilled in the art.

The second buffer layer 120 may be provided on an upper end of each of the first buffer layer 110 and the first pad part 630. In one embodiment, the second buffer layer 120 may include a first layer 121, a second layer 123, and a third layer 125. Here, the first layer 121, the second layer 123, and the third layer 125 of the second buffer layer 120 may each be a metal buffer layer and may be formed of a material which is the same as or different from that of the first buffer layer 110. For example, in the multi-buffer layer 100, the first layer 121 and the second layer 123 of the second buffer layer 120 may be formed of SiNx, and the third layer 125 may be formed of SiO$_2$, thereby enhancing a water vapor transmission rate (WVTR) and improving visibility. The second buffer layer 120 may be deposited on the first buffer layer 110 and the first pad part 630 through a sputtering process or an e-beam evaporation process. Accordingly, the second buffer layer 120 may planarize the first buffer layer 110 on which the first pad part 630 is provided.

The third buffer layer 130 may be provided on an upper end of the second buffer layer 120. According to an embodiment, the third buffer layer 130 may be a metal buffer layer and may be formed of a material which is the same as or different from that of the first buffer layer 110 or the second buffer layer 120. For example, the third buffer layer 130 may be formed of SiOx, SiNx, SiON, or the like, or the combination thereof. The third buffer layer 130 may be deposited on the second buffer layer 120 through a sputtering process or an e-beam evaporation process.

Therefore, the display apparatus according to the present embodiment may include the first to third buffer layers 110 to 130 sequentially stacked on the sacrificial layer and the first pad part 630 surrounded by the first and second buffer layers 110 and 120, thereby preventing light leakage, preventing visibility from being reduced, and enhancing the WVTR.

A pixel array layer may include a TFT T, a planarization layer 310, a filling layer 330, an organic light emitting device E, and a bank 350.

The TFT T may be provided in the display area AA on the multi-buffer layer 100. The TFT T may include a semiconductor layer 210, a gate insulation layer 220, a gate electrode 230, a passivation layer 240, a source electrode 250, and a drain electrode 260.

The semiconductor layer 210 may be provided in the display area AA on the first buffer layer 110. The semiconductor layer 210 may be disposed to overlap the gate electrode 230, the source electrode 250, and the drain electrode 260. The semiconductor layer 210 may directly contact the source electrode 250 and the drain electrode 260 and may face each other with the gate electrode 230 and the gate insulation layer 220 therebetween. According to an embodiment, a portion of the semiconductor layer 210 may be formed of a dopant-undoped semiconductor material, and another portion of the semiconductor layer 210 may be formed of a dopant-doped semiconductor material.

According to an embodiment, the semiconductor layer 210 may be pattern-formed on the multi-buffer layer 100 and may be formed of an oxide semiconductor such as zinc oxide, tin oxide, Ga—In—Zn oxide, In—Zn oxide, or In—Sn oxide, but without being limited thereto, the semiconductor layer 210 may be formed of a silicon-based semiconductor. For example, the semiconductor layer 210 may include a drain region and a source region which is formed to have conductivity through a conductive process, and may include a channel region which is formed not to have conductivity through the conductive process. Here, the drain region and the source region may be provided in parallel with the channel region therebetween. The channel region of the semiconductor layer 210 may overlap the gate insulation layer 220.

The gate insulation layer 220 may be provided in the channel region of the semiconductor layer 210. In detail, the gate insulation layer 220 may be disposed on the semiconductor layer 210 and may insulate the semiconductor layer 210 from the gate electrode 230. The gate insulation layer 220 may be formed of an inorganic insulation material, and for example, may be formed of SiOx, SiNx, SiON, or a multilayer thereof, but is not limited thereto.

The gate electrode 230 may be provided on the gate insulation layer 220 and may be formed along with a gate line GL. In detail, the gate electrode 230 may overlap a center region of the semiconductor layer 210 with the gate insulation layer 220 therebetween. The gate electrode 230 may be pattern-formed on the gate insulation layer 220 to overlap the channel region of the semiconductor layer 210. The gate electrode 230 may act as a mask which allows the channel region of the semiconductor layer 210 not to have conductivity due to a dry etching gas when performing a patterning process of patterning the gate insulation layer 220 by using a dry etching process. For example, the gate electrode 230 may be formed of a single layer or a multilayer which includes one of molybdenum (Mo), aluminum (Al), chromium (Cr), gold (Au), titanium (Ti), nickel (Ni), neodymium (Nd), and copper (Cu), or an alloy thereof.

The passivation layer 240 may be provided on the gate electrode 230. In detail, the passivation layer 240 may be provided on a whole surface of the display area AA including the gate electrode 230. The passivation layer 240 may perform a function of protecting the TFT T. The passivation layer 240 may be formed of an inorganic insulation material, and for example, may be formed of SiOx, SiNx, SiON, or a multilayer thereof, but is not limited thereto. In the passivation layer 240, a corresponding region may be removed in order for the semiconductor layer 210 to contact the source electrode 250 or the drain electrode 260. For example, the passivation layer 240 may include a first contact hole, through which the source electrode 250 passes, and a second contact hole through which the drain electrode 260 passes.

The source electrode 250 and the drain electrode 260 may be provided on the passivation layer 240 and may be spaced apart from each other. In detail, the source electrode 250 and the drain electrode 260 may be formed along with a data line DL and a power supply line PL.

The source electrode 250 may contact one end of the semiconductor layer 210 through the first contact hole provided in the passivation layer 240 and may directly contact an anode electrode 410 of the organic light emitting device E through a third contact hole of the planarization layer 310. Also, the drain electrode 260 may be the other end of the semiconductor layer 210 through the second contact hole provided in the passivation layer 240.

The planarization layer 310 may be provided on the TFT T to planarize an upper end of the TFT T. In the planarization layer 310, a corresponding region may be removed in order for the anode electrode 410 to contact the source electrode 250. For example, the planarization layer 310 may include the third contact hole through which the anode electrode 410 passes. According to an embodiment, the planarization layer 310 may be formed of an organic insulating material such as acryl resin, epoxy resin, phenolic resin, polyamide resin, or polyimide resin, but is not limited thereto.

The filling layer 330 may be provided on the planarization layer 310, and a corresponding region of the filling layer 330 may be removed in order for the anode electrode 410 to contact the source electrode 250. For example, the filling layer 330 may include a fourth contact hole through which the anode electrode 410 passes. Here, the third contact hole of the planarization layer 310 may be connected to the fourth contact hole of the filling layer 330 in order for the anode electrode 410 to pass through the third and fourth contact holes.

The bank 350 may be provided on the filling layer 330. The bank 350 may be provided between adjacent anode electrodes 410 and may divide a plurality of anode electrodes 410. Therefore, the bank 350 may electrically insulate the adjacent anode electrodes 410. The bank 350 may be formed of an organic insulating material (for example, polyimide resin, acryl resin, or benzocyclobutene (BCB)), but is not limited thereto.

The organic light emitting device E may be provided on the filling layer 330 and may be electrically connected to the TFT T. The organic light emitting device E may include the anode electrode 410, an organic light emitting layer 430, and a cathode electrode 450.

The anode electrode 410 may be provided on the filling layer 330. The anode electrode 410 may contact the source electrode 250 of the TFT T through the third contact hole provided in the planarization layer 310 and the fourth contact hole provided in the filling layer 330. According to an embodiment, the anode electrode 410 may be formed of a transparent conductive material such as indium tin oxide (ITO), indium zinc oxide (IZO), zinc oxide (ZnO), or indium oxide ($In_2O_3$) having a high work function value and may act as an anode.

The organic light emitting layer 430 may be provided on the anode electrode 410. In detail, the organic light emitting layer 430 may be provided in an emission area of each of a plurality of pixels P defined on the anode electrode 410. Here, the emission area of each of the plurality of pixels P may be a portion other than an edge of the anode electrode 410 and may be defined by the bank 350 provided on the filling layer 330. That is, the bank 350 may be provided to cover the edge of the anode electrode 410 and the TFT T, and thus, the portion other than the edge of the anode electrode 410 may be exposed. Therefore, the organic light emitting layer 430 may be provided on the anode electrode 410 in the emission area defined by the bank 350. According to an embodiment, the organic light emitting layer 430 may include a hole transporting layer (not shown), an organic light emitting layer (not shown), and an electron transporting layer (not shown). Also, the organic light emitting layer 430 may further include at least one function layer for enhancing the emission efficiency and lifetime of a light emitting layer.

The cathode electrode 450 may be provided on the organic light emitting layer 430. The cathode electrode 450 may be implemented in an electrode form provided in common in all of the pixels without being individually provided in each of a plurality of pixel areas. That is, the cathode electrode 450 may be provided on the bank 350 as well as the organic light emitting layer 430. When a voltage is applied to the anode electrode 410 and the cathode electrode 450, a hole and an electron may move to the light emitting layer through the hole transporting layer and the electron transporting layer and may be combined in the light emitting layer to emit light. The cathode electrode 450 may act as a cathode of an organic light emitting display apparatus and may be formed of an opaque metal material, and for example, may be formed of lithium (Li), calcium (Ca), LiF/Ca, LiF/Al, Al, or Mg, or a compound thereof.

The encapsulation layer 370 may be provided on a whole upper end of the cathode electrode 450. The encapsulation layer 370 may prevent external water or the like from penetrating into the inside, thereby preventing the deterioration of the organic light emitting layer 430. According to an embodiment, the encapsulation layer 370 may be formed of metal, such as Cu or Al, or an alloy thereof, but without being limited thereto, the encapsulation layer 370 may be formed of various materials well known to those skilled in the art. For example, the encapsulation layer 370 may be provided on a whole upper surface of the multi-buffer layer 100, and thus, may be formed through an atomic layer deposition process rather than a sputtering process, for improving the quality of layers and preventing penetration of water.

The encapsulation substrate 500 may be provided on a whole upper end of the encapsulation layer 370. The encapsulation substrate 500 may be disposed on the pixel array layer, for protecting the TFT T and the organic light emitting device E from external water, air, or the like. Also, the encapsulation substrate 500 may be disposed on the multi-buffer layer 100. According to an embodiment, the encapsulation substrate 500 may be disposed so as to be opposite to the multi-buffer layer 100, and the multi-buffer layer 100 and the encapsulation substrate 500 may be bonded to each other by a sealing member (not shown) disposed along an edge thereof. For example, the encapsulation substrate 500 may be a plastic substrate, a glass substrate, or the like.

The encapsulation substrate 500 may be formed of an engineering plastic material (for example, polyethyleneterephthalate (PET)) which is transparent and has flexibility. According to an embodiment, the encapsulation substrate 500 may be attached on an upper surface of the encapsulation layer 370 by a substrate adhesive member, and thus, may act as a supporting substrate in a process of attaching a lower surface of the multi-buffer layer 100 on a circuit film 610 and providing a polarizing film 700. Also, after a process of forming the circuit film 610 and the polarizing film 700 on the lower surface of the multi-buffer layer 100 is completed, the encapsulation substrate 500 may maintain a state of being attached on the upper surface of the encapsulation layer 370. Therefore, the encapsulation substrate 500 may support the polarizing film 700 provided in the display area AA and the circuit film 610 provided in the non-display area PA2. As a result, in the display apparatus according to the present embodiment, the encapsulation substrate 500 may simultaneously support the display area AA and the non-display areas PA1 and PA2 without applying the base substrate (for example, the polyimide substrate) of the display panel, and thus, a crack is prevented from occurring in a release process, thereby enhancing visibility and reliability. That is, the encapsulation substrate 500 that is positioned on top of the encapsulation layer 370 close to the surface of the display apparatus, can provide structural support at the opposite side of the of the display apparatus, for example, near the polarizing film 700. Due to this structure, an additional base substrate of a display panel is not required.

According to an embodiment, a display apparatus may display an image in a type such as a top emission type or a bottom emission type, based on a structure of a pixel array layer including an anode electrode, a cathode electrode, and an organic compound layer. In the top emission type, the display apparatus may display an image by irradiating visible light, emitted from the pixel array layer, onto a polarizing film. In the bottom emission type, the display apparatus may display an image by irradiating the visible light, emitted from the pixel array layer, onto a base substrate.

When the related art display apparatus is implemented as the bottom emission type, the related art display apparatus includes a base substrate including a glass material or a plastic material including transparent polyimide. Here, in the related art display apparatus, since visible light emitted from a pixel array layer passes through a base substrate, a viewing angle and reflectivity are deteriorated. Therefore, when the display apparatus according to the present disclosure is implemented as the bottom emission type, the encapsulation substrate 500 may simultaneously support the display area AA and the non-display areas PA1 and PA2 without applying the base substrate, and thus, the base substrate may be removed from a path of the visible light emitted from the pixel array layer, thereby enhancing visibility and reliability.

According to an embodiment, since the base substrate (for example, the polyimide substrate) is not applied to the display apparatus, retardation is complemented despite using the polarizing film 700 which does not include a C plate. In detail, in the related art display apparatus, since the visible light emitted from the pixel array layer passes through the base substrate, visibility is deteriorated. Also, in the related art display apparatus, the polarizing film including the C plate is used for enhancing visibility, but visibility is lower than a case where the base substrate is not used. In order to solve such a problem, the display apparatus according to the present disclosure may not apply the base substrate (for example, the polyimide substrate) and may include the circuit film 610 which is connected to the first pad part 630 through the first hole pattern 111 at the other surface of the first buffer layer 110, and may simultaneously support the polarizing film 700 and the circuit film 610 by using the encapsulation film 500, thereby complementing retardation despite using the polarizing film 700 which does not include the C plate.

According to another embodiment, the encapsulation substrate 500 may be formed of a flexible plastic material (for example, transparent polyimide). In this case, the encapsulation substrate 500 may be formed by curing polyimide which is coated to have a certain thickness on an upper surface of a release layer provided on a carrier glass substrate of a sacrificial layer which is relatively thick. Therefore, the encapsulation substrate 500 may be attached on the upper surface of the encapsulation layer 370 by the substrate adhesive member, and thus, may act as a supporting substrate in a process of attaching the circuit film 610 on the lower surface of the multi-buffer layer 100 and providing the polarizing film 700. Also, after a process of forming the circuit film 610 and the polarizing film 700 on the lower surface of the multi-buffer layer 100 is completed, the encapsulation substrate 500 may maintain a state of being attached on the upper surface of the encapsulation layer 370.

The circuit film 610 may be connected to the first pad part 630 provided in the non-display area PA2 and may allow each of the plurality of pixels P to display an image corresponding to video data supplied from a display driving system. According to an embodiment, the circuit film 610 may be connected to a gate driving circuit (not shown).

The light shielding layer 670 may be provided on the first buffer layer 110 to overlap the semiconductor layer 210 of the TFT T, thereby protecting the semiconductor layer 210 from external light. In detail, the light shielding layer 670 and the first pad part 630 may be disposed on the same layer and may be spaced apart from each other. In more detail, the light shielding layer 670 may be provided in an area overlapping the semiconductor layer 210 of the TFT T, on the first buffer layer 110, and the first pad part 630 may be provided in the non-display area PA2 on the first buffer layer 110. Therefore, the first pad part 630 and the light shielding layer 670 may be simultaneously provided, through a one-time patterning process, in the non-display area PA2 on the first buffer layer 110 and in an area overlapping the semiconductor layer 210. As a result, in the related art display apparatus, the light shielding layer corresponding to the TFT and the black matrix corresponding to the bezel area are formed through separate processes. On the other hand, in the display apparatus according to the present disclosure, the first pad part 630 provided in the non-display area PA2 and the light shielding layer 670 overlapping the semiconductor layer 210 may be simultaneously formed through a one-time patterning process, thereby reducing the process cost and a process time, enhancing reliability, and forming a precise light shielding pattern. As described above, in the display apparatus according to the present disclosure, since the precise light shielding pattern is formed, light leakage is prevented, and visibility is not reduced.

The damp proofing insulation member 690 may cover a contact surface between the circuit film 610 and the first buffer layer 110. In detail, the damp proofing insulation member 690 may seal a contact surface between the circuit film 610 and the first pad part 630 and a contact surface between the circuit film 610 and the first buffer layer 110, thereby preventing water or particles from penetrating into the first pad part 630. Accordingly, the damp proofing insulation member 690 may prevent the first pad part 630 electrically connected to the circuit film 610 from being electrode-short-circuited due to reaction with temperature change, water, corrosive gas, or conductive particles, which is an example of external conditions.

The polarizing film 700 may be provided in the display area AA under the first buffer layer 110. In detail, the polarizing film 700 may be attached on the lower surface of the first buffer layer 110 by the film adhesive member 710. The polarizing film 700 may circularly polarize external light reflected by the TFT T and/or pixel driving lines provided on the pixel array layer, thereby enhancing the visibility and contrast ratio of the display apparatus.

According to an embodiment, the polarizing film 700 and the circuit film 610 may be provided on the same layer and may be spaced apart from each other. In detail, the polarizing film 700 may be provided in the display area AA under the first buffer layer 110, and the circuit film 610 may be provided in the non-display area PA2 under the first buffer layer 110. Therefore, the encapsulation substrate 500 may simultaneously support the polarizing film 700 provided in the display area AA and the circuit film 610 provided in the non-display area PA2. Accordingly, in the display apparatus according to the present embodiment, the encapsulation substrate 500 may simultaneously support the display area AA and the non-display areas PA1 and PA2 without applying the base substrate (for example, the polyimide substrate) of the display panel, and thus, a crack is prevented from occurring in a release process, thereby enhancing visibility and reliability.

Figure 3:
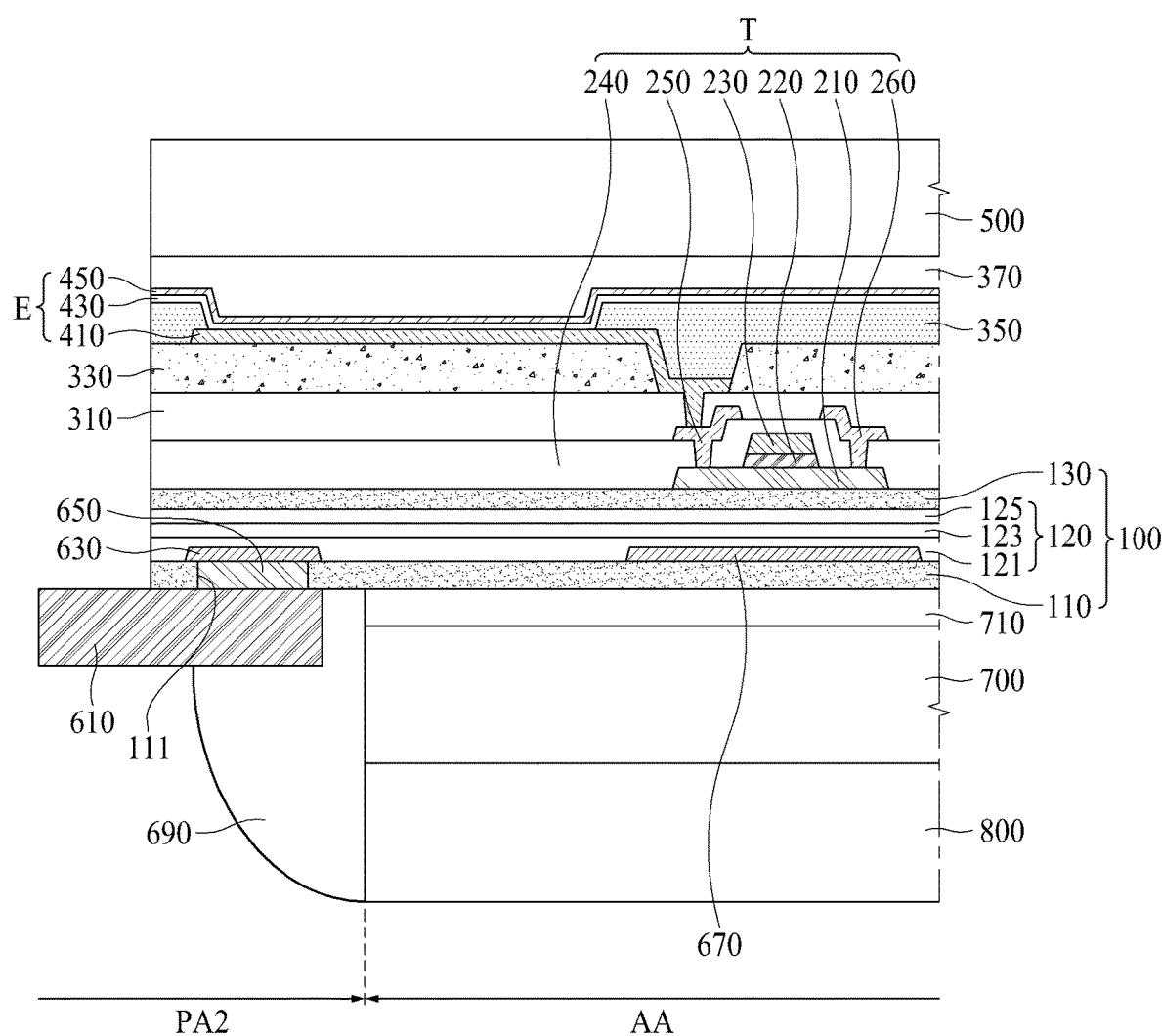
FIG. 3 is a cross-sectional view taken along line I-I' illustrated in FIG. 1, in a display apparatus according to another embodiment of the present disclosure.

FIG. 3 is a cross-sectional view taken along line I-I' illustrated in FIG. 1, in a display apparatus according to another embodiment of the present disclosure. The display apparatus of FIG. 3 may include a barrier film 800 and a modified damp proofing insulation member 690 unlike the display apparatus of FIG. 2. Hereinafter, the elements will be mainly described, and overlapping descriptions of the other elements are omitted or will be briefly given.

Referring to FIG. 3, the display apparatus may further include a barrier film 800 provided under a polarizing film 700. In detail, the barrier film 800 may be formed of a material which is good in effect of blocking gas and water and is good in light transmittance. For example, the barrier film 800 may be formed of an inorganic material such as SiOx, oxide aluminum (AlxOy), oxide tantalum (TaxOy), or oxide titanium (TiOx). The barrier film 800 may be coated on a surface of the polarizing film 700 in a high vacuum state through a sol-gel process or a vacuum deposition process such as a plasma enhanced chemical vapor deposition (PECVD) process or a sputtering process. Accordingly, the barrier film 800 prevents water or particles from penetrating into the display apparatus, thereby enhancing the durability of the display apparatus.

According to an embodiment, a damp proofing insulation member 690 may cover a contact surface between a circuit film 610 and a first buffer layer 110, and simultaneously, may cover side surfaces of the polarizing film 700 and the barrier film 800. In detail, the damp proofing insulation member 690 may cover the contact surface between the circuit film 610 and the first buffer layer 110 and may seal the side surfaces of the polarizing film 700 and the barrier film 800, thereby prevents water or particles from penetrating into the display apparatus. Accordingly, the damp proofing insulation member 690 prevents water or particles from penetrating into the display apparatus, thereby enhancing the durability of the display apparatus.

FIGS. 4A to 4F are process cross-sectional views schematically illustrating a method of manufacturing a display apparatus according to an embodiment of the present disclosure and are process cross-sectional views taken along line I-I' illustrated in FIG. 2.

Figure 4A:
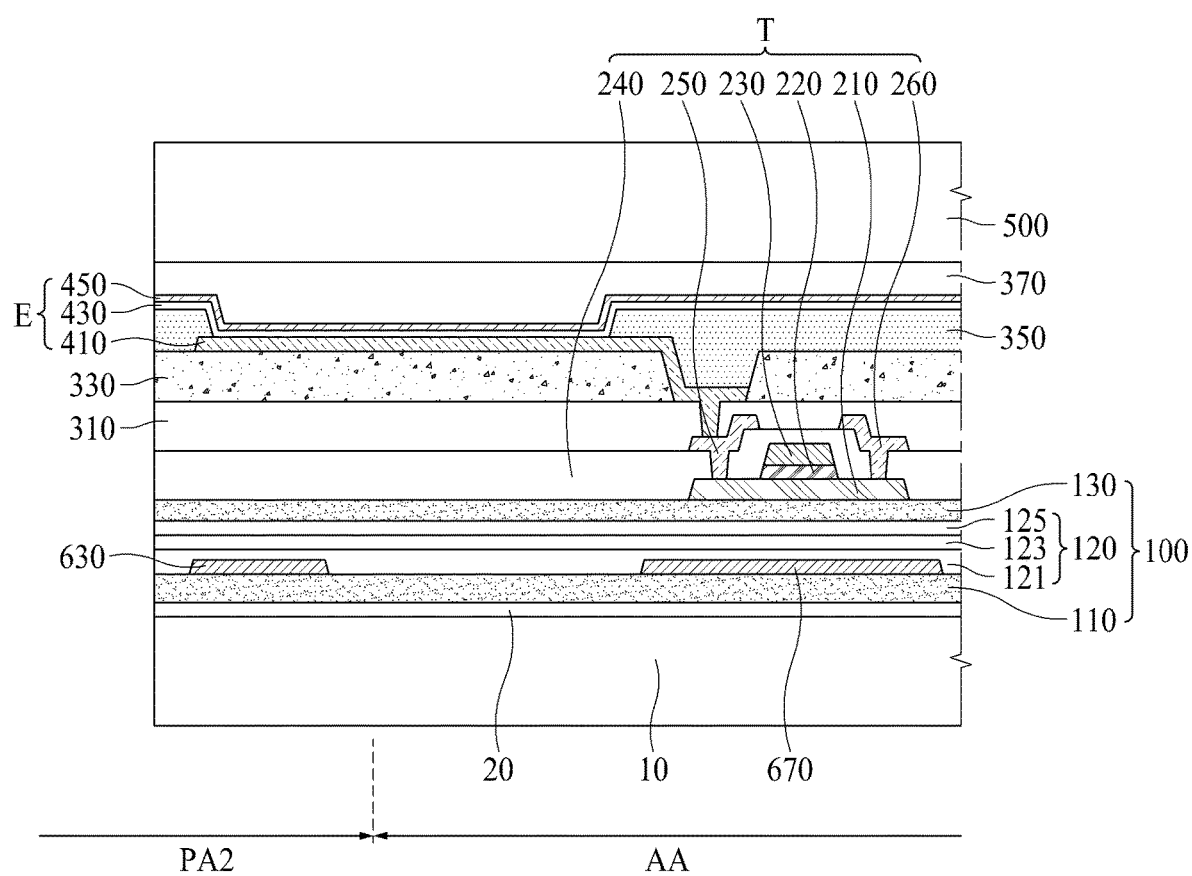
FIGS. 4A to 4F are process cross-sectional views schematically illustrating a method of manufacturing a display apparatus according to an embodiment of the present disclosure and are process cross-sectional views taken along line I-I' illustrated in FIG. 2.

Referring to FIG. 4A, in order to manufacture the display apparatus according to the present disclosure, a plurality of sacrificial layers 10 and 20 may be provided. According to an embodiment, the plurality of sacrificial layers 10 and 20 may include a carrier glass substrate 10 and a release layer 20 stacked on the carrier glass substrate 10. A multi-buffer layer 100, a pixel array layer, an encapsulation layer 370, and an encapsulation substrate 500 may be sequentially stacked on the plurality of sacrificial layers 10 and 20. Also, in the display apparatus according to the present disclosure, since a base substrate (for example, a polyimide substrate) is not applied, the sacrificial layers 10 and 20 may support the multi-buffer layer 100, the pixel array layer, the encapsulation layer 370, and the encapsulation substrate 500 while the multi-buffer layer 100, the pixel array layer, the encapsulation layer 370, and the encapsulation substrate 500 are being sequentially stacked. Therefore, each of the sacrificial layers 10 and 20 may temporarily act as a supporting substrate. Also, when stacking of the multi-buffer layer 100, the pixel array layer, the encapsulation layer 370, and the encapsulation substrate 500 is completed, the sacrificial layers 10 and 20 may be removed. When the sacrificial layers 10 and 20 are removed, the encapsulation substrate 500 may support a display area AA and non-display areas PA1 and PA2 of the display apparatus.

According to an embodiment, a first buffer layer 110 may be formed of $SiO_2$, and the release layer 20 of the sacrificial layers 10 and 20 may be formed of a-Si or SiNx, whereby the first buffer layer 110 may be separated from the sacrificial layers 10 and 20 through a laser release process. In detail, in the display apparatus according to the present disclosure, since a base substrate (for example, a polyimide substrate) is not applied, the first buffer layer 110 provided in a lowermost portion of the multi-buffer layer 100 may directly contact the release layer 20 of the sacrificial layers 10 and 20. Therefore, the reliability of the laser release process may be determined based on a material of each of the first buffer layer 110 and the release layer 20 of the sacrificial layers 10 and 20. That is, since the release layer 20 of the sacrificial layers 10 and 20 is formed of a-Si or SiNx, the release layer 20 of the sacrificial layers 10 and 20 may be easily separated from the first buffer layer 110. Therefore, in the display apparatus according to the present disclosure, since the first buffer layer 110 is formed of $SiO_2$ and the release layer 20 of the sacrificial layers 10 and 20 is formed of a-Si or SiNx, the sacrificial layers 10 and 20 may be removed through the laser release process even without applying the base substrate.

Figure 4B:
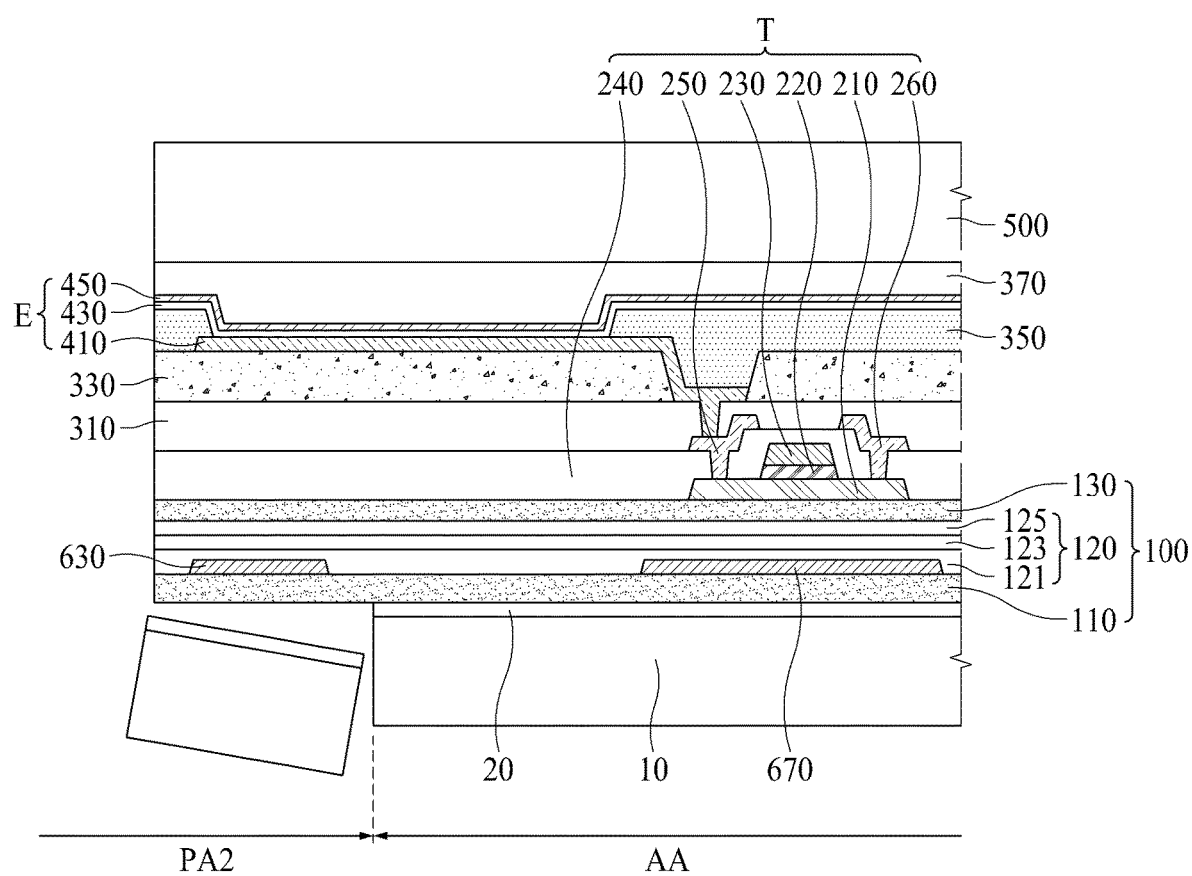

Referring to FIG. 4B, a portion of each of the sacrificial layers 10 and 20 may be removed through a laser release process. In detail, the sacrificial layers 10 and 20 disposed in the non-display area PA2 may be partially removed for an attachment process of attaching a circuit film 610. Even when a portion of each of the sacrificial layers 10 and 20 disposed in the non-display area PA2 is removed, the encapsulation substrate 500 may still support a first pad part 630 disposed in the non-display area PA2 and the circuit film 610 electrically connected to the first pad part 630. Therefore, in the display apparatus according to the present disclosure, instead of removing all of the sacrificial layers 10 and 20, only the portion of each of the sacrificial layers 10 and 20 disposed in the non-display area PA2 may be removed, and thus, a crack is prevented from occurring in a release process, thereby enhancing visibility and reliability.

Figure 4C:
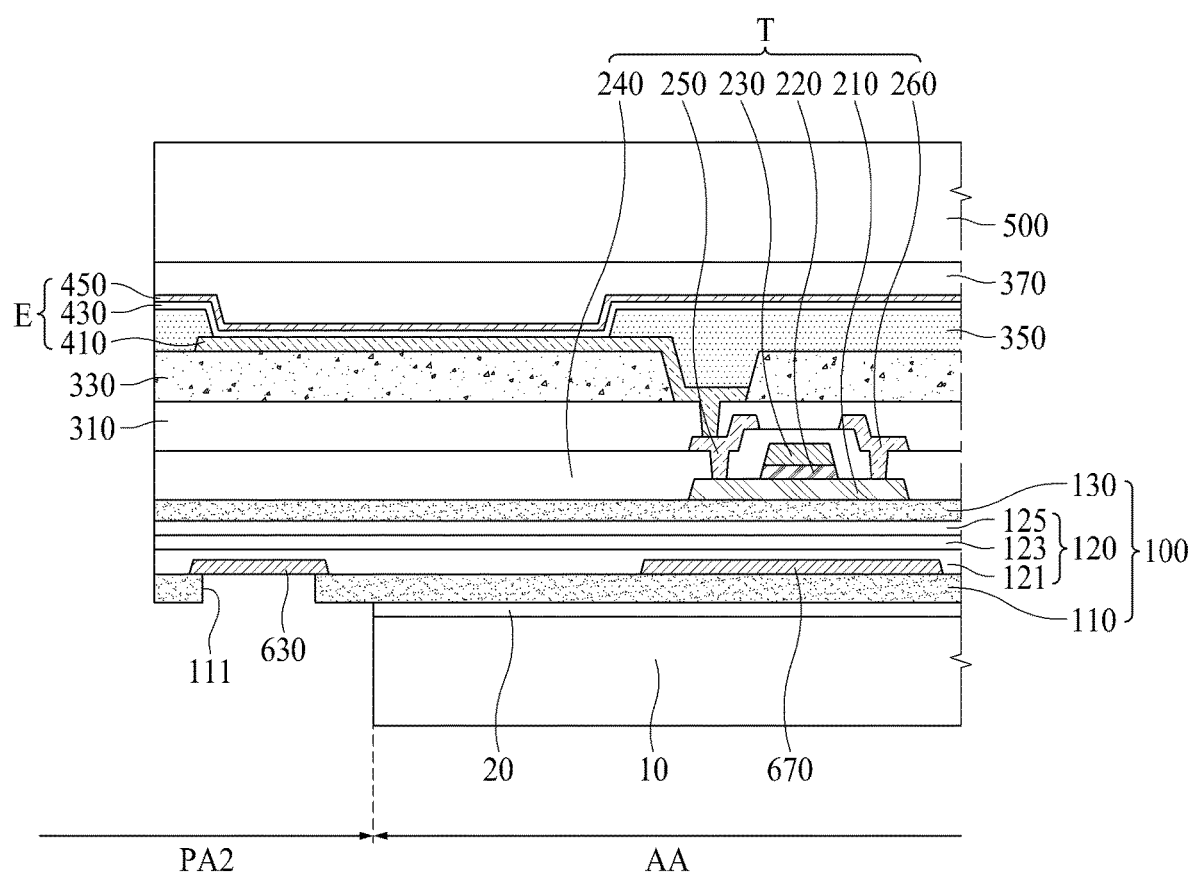

Referring to FIG. 4C, a hole pattern 110 may be provided on the first buffer layer 110 provided in an area overlapping the first pad part 630. The first hole pattern 111 may be provided in the non-display area PA2 of the first buffer layer 110, for exposing the first pad part 630 in a direction opposite to the encapsulation substrate 500. The first hole pattern 111 may be filled with an ACF 650 which attaches a circuit film 610 on the first pad part 630.

Figure 4D:
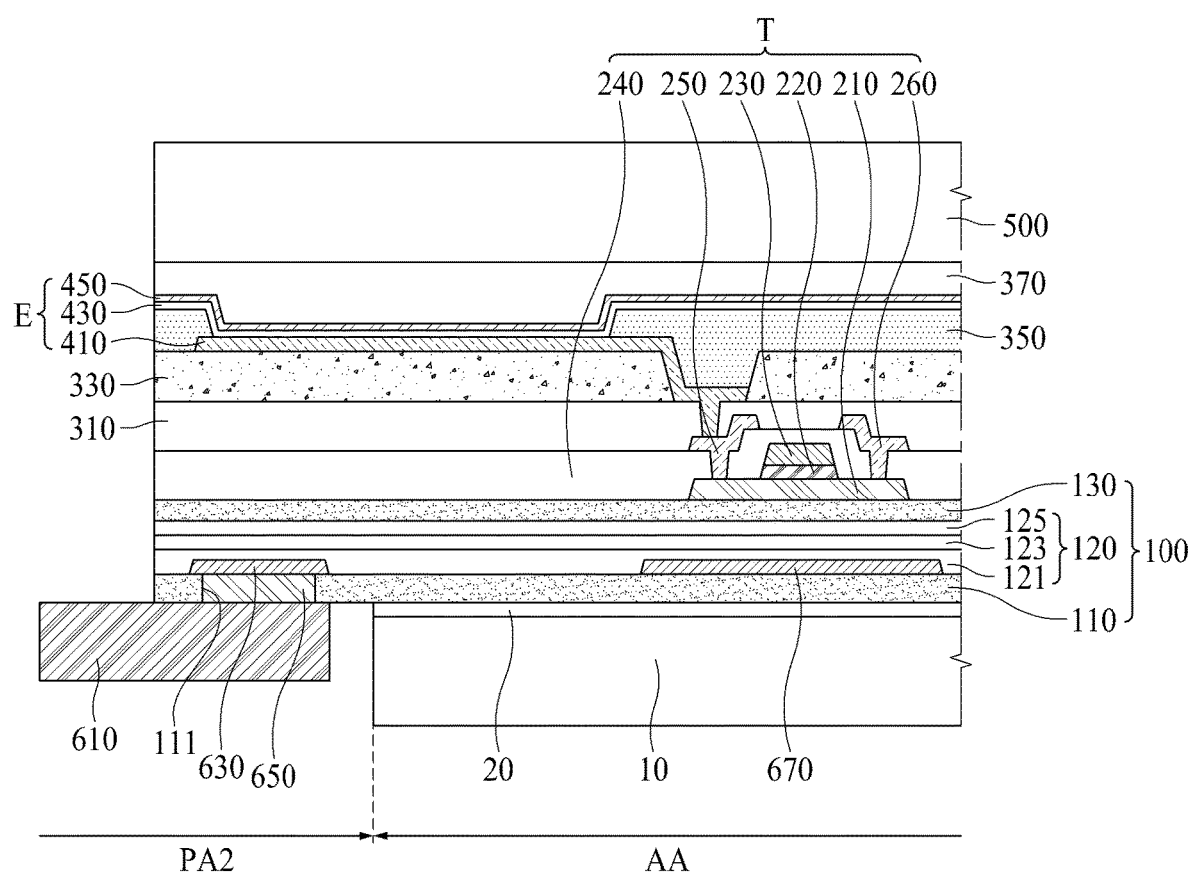

Referring to FIG. 4D, the circuit film 610 may be electrically connected to the first pad part 630 through the ACF 650 filled into the first hole pattern 111. That is, the circuit film 610 and the first pad part 630 may face each other with the first hole pattern 111 therebetween. As a result, the first hole pattern 111 may be exposed in a direction opposite to the encapsulation substrate 500, and the circuit film 610 may be connected to the first pad part 630 at the other surface of the first buffer layer 110, whereby the circuit film 610 may be supported by the encapsulation substrate 500 even without the base substrate.

Figure 4E:
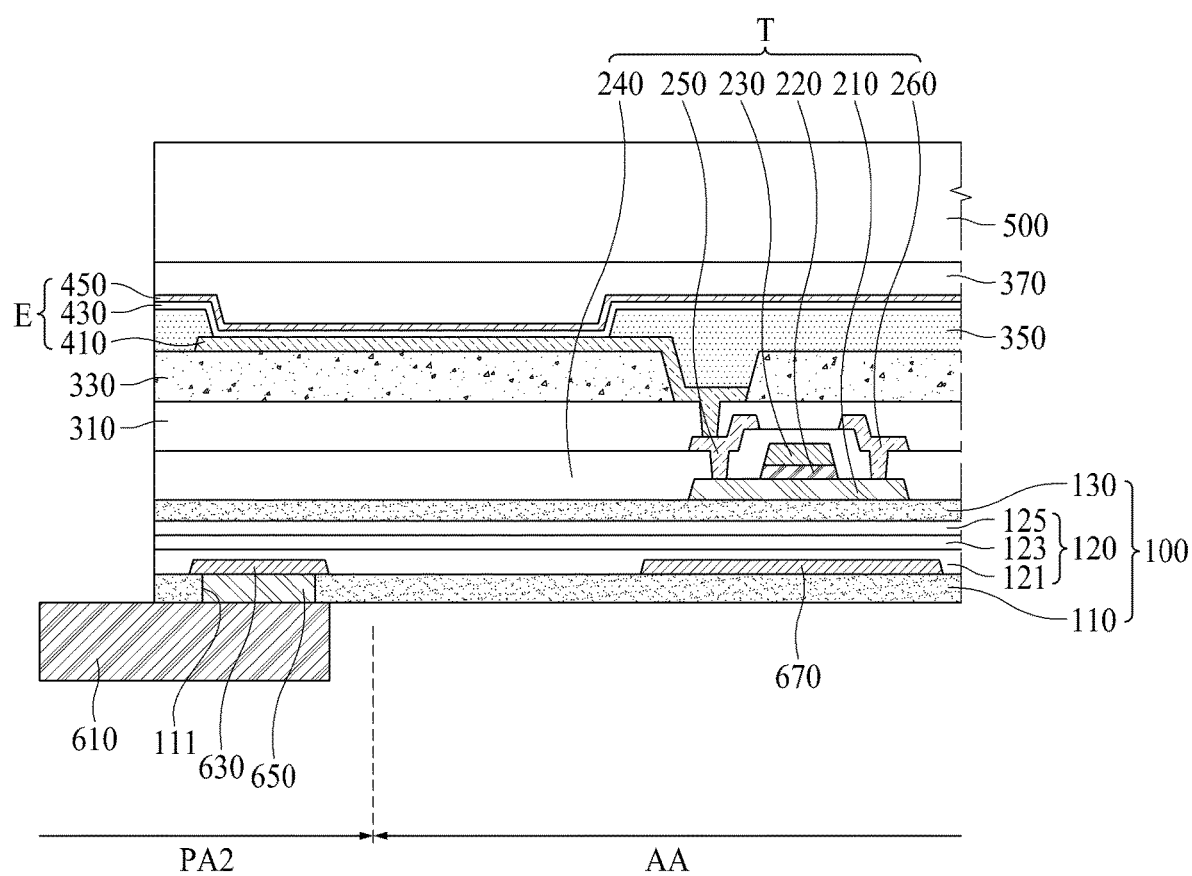

Referring to FIG. 4E, the other portion of each of the sacrificial layers 10 and 20 may be removed through a laser release process after the attachment process of attaching the circuit film 610 is completed. In detail, a portion of each of the sacrificial layers 10 and 20 disposed in the display area AA may be removed for an attachment process of attaching a polarizing film 700. Even when a portion of each of the sacrificial layers 10 and 20 disposed in the display area AA is removed, the encapsulation substrate 500 may still support the multi-buffer layer 100 and the pixel array layer.

Figure 4F:
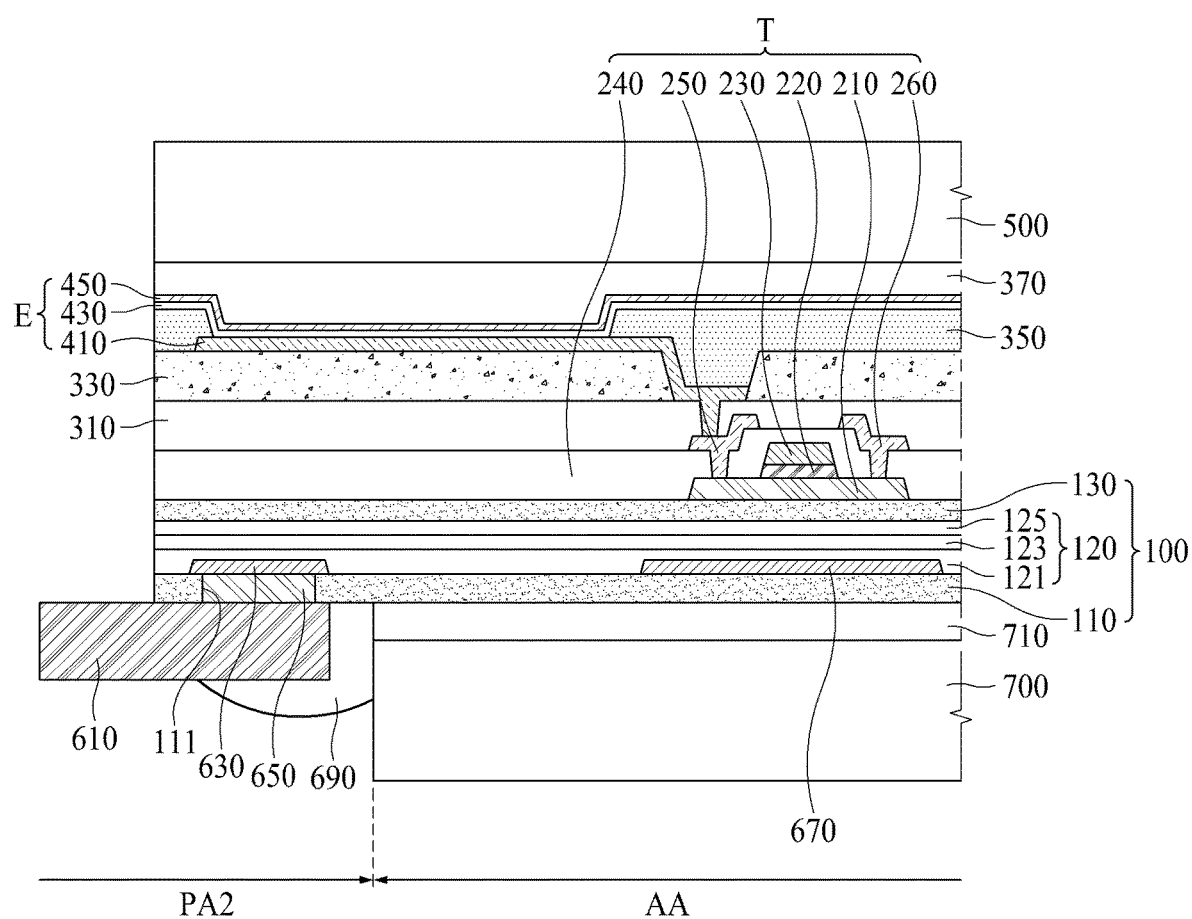

Referring to FIG. 4F, the polarizing film 700 may be provided in the display area AA under the first buffer layer 110. In detail, the polarizing film 700 may be attached on a lower surface of the first buffer layer 110 by a film adhesive member 710. The polarizing film 700 may circularly polarize external light reflected by a TFT T and/or pixel driving lines provided on the pixel array layer, thereby enhancing the visibility and contrast ratio of the display apparatus. According to an embodiment, the display apparatus may further include a barrier film 800 provided under the polarizing film 700.

Therefore, in the display apparatus according to the present embodiment, since the encapsulation substrate 500 simultaneously supports the display area AA and the non-display areas PA1 and PA2 without applying the base substrate (for example, the polyimide substrate) of the display panel, a crack is prevented from occurring in a release process, and retardation is complemented despite using the polarizing film 700 which does not include a C plate, thereby enhancing visibility and preventing the partial detachment of a layer and penetration of water and particles to enhance reliability.

As described above, in the display apparatus according to the embodiments of the present disclosure, the display area and the non-display area may be simultaneously supported by the encapsulation substrate without applying the base substrate of the display panel, thereby enhancing visibility and reliability.

Moreover, in the display apparatus according to the embodiments of the present disclosure, the polarizing film provided in the display area and the circuit film electrically connected to the pad part provided in the non-display area may be provided on the same layer, and thus, the display area and the non-display area may be simultaneously supported by the encapsulation substrate even without applying the base substrate.

Moreover, in the display apparatus according to the embodiments of the present disclosure, the pad part and the light shielding layer may be provided on the same layer, and the plurality of buffer layers may surround the pad part, thereby enhancing a water vapor transmission rate.

Moreover, in the display apparatus according to the embodiments of the present disclosure, the release process may be separately performed on each of the non-display area and the display area, and thus, a crack is prevented from occurring in the release process, thereby reinforcing rigidity.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method for manufacturing a display apparatus including a display area and a non-display area adjacent to the display area, comprising:
    forming a plurality of sacrificial layers on both the display area and the non-display area;
    sequentially stacking a plurality of buffer layers, a pixel array layer, an encapsulation layer, and an encapsulation substrate on the plurality of sacrificial layers;
    removing the plurality of sacrificial layers in the non-display area;
    forming hole patterns at overlying locations corresponding to pad parts provided in the plurality of buffer layers in the non-display area, to expose the pad parts in a direction opposite to the encapsulation substrate;

forming respective anisotropic conductive films in each of the hole patterns, each of the pad parts being electrically connected to respective circuit films via the respective anisotropic conductive films; and removing the plurality of sacrificial layers in the display area.

2. The method according to claim 1, further comprising:
attaching a polarizing film to a surface of the plurality of buffer layers on an opposing side of the pixel array layer in the display area.

3. The method according to claim 2, further comprising:
forming a barrier film disposed under the polarizing film.

4. The method according to claim 1, wherein the encapsulation substrate provides support for both the display area and the non-display area of the display apparatus and provides structural support at the bottom surface of the display apparatus.

5. The method according to claim 1, wherein
the plurality of buffer layers includes a first buffer layer, a second buffer layer, and a third buffer layer,
the third buffer layer, the second buffer layer and the first buffer layer are sequentially formed under the pixel array layer,
the third buffer layer contacts the pixel array layer,
the pad parts are formed in the second buffer layer, and
the hole patterns are formed in the first buffer layer.

6. The method according to claim 5, wherein
the second buffer layer includes a first layer, a second layer, and a third layer, and
the first and second buffer layers are formed of SiNx and the third layer is formed of $SiO_2$.

7. The method according to claim 5, wherein
the non-display area includes a first non-display area adjacent to one end of each of a plurality of gate lines and a second non-display area adjacent to one end of each of a plurality of power lines and a plurality of data lines,
the pad parts include a first pad part disposed in the second non-display area and second and third pad parts disposed in the first non-display area, and
the hole patterns include first, second and third hole patterns respectively corresponding to position overlying the first, second and third pad parts.

8. The method according to claim 7, wherein
the first pad part is electrically connected to a first circuit film among the circuit films through the first hole pattern formed in the first buffer layer and electrically connected to a corresponding gate line among the plurality of gate lines,
the second pad part is electrically connected to an external circuit through the second hole pattern and electrically connected to a corresponding data line among the plurality of data lines, and
the third pad part is electrically connected to an external circuit through the third hole pattern and electrically connected to a corresponding power line among the plurality of power lines.

9. The method according to claim 8, wherein
the first hole pattern is filled with a first anisotropic conductive film among the anisotropic conductive films, and
the first anisotropic conductive film couples the first circuit film to the first pad part.

10. The method according to claim 1, further comprising:
forming a light shielding layer in an area in the second buffer layer that overlaps a semiconductor layer of a thin film transistor in each of a plurality of pixels.

11. The method according to claim 1, further comprising:
forming a damp proofing insulation member to cover a contact surface between a first circuit film among the circuit films and a surface of the plurality of buffer layers on an opposing side of the pixel array layer.

12. The method according to claim 1, wherein
the encapsulation substrate is a glass substrate or a plastic substrate.

13. The method according to claim 1, wherein a first circuit film among the circuit films is electrically connected to a gate driving circuit.

14. The method according to claim 1, wherein the pixel array layer comprises:
a thin film transistor formed in the display area;
a planarization layer provided on the thin film transistor to planarize an upper end of the thin film transistor; and
an organic light emitting device provided on the planarization layer and electrically connected to the thin film transistor.

15. The method according to claim 1, wherein the removing the plurality of sacrificial layers in the non-display area includes:
removing the plurality of sacrificial layers in the non-display area through a laser release process.

16. The method according to claim 1, wherein the removing the plurality of sacrificial layers in the display area includes:
removing the plurality of sacrificial layers in the display area through a laser release process.

17. A method for manufacturing a display apparatus including a display area and a non-display area adjacent to the display area, comprising:
forming at least one sacrificial layer on both the display area and the non-display area;
forming at least one buffer layer, at least one thin film transistor, and at least one light emitting device on the at least one sacrificial layer;
forming a pad part on the at least one buffer layer in the non-display area;
removing a portion of the at least one sacrificial layer in the non-display area to expose a first surface of the at least one buffer layer;
removing a portion of the at least one buffer layer from the first surface and form a hole pattern within the at least one buffer layer, the hole pattern exposing the pad part;
forming an anisotropic conductive film in the hole pattern;
forming a circuit film on the first surface of the at least one buffer layer and the anisotropic conductive film, the pad parts being electrically connected to the circuit film via the anisotropic conductive film; and
removing the at least one sacrificial layer in the display area.

18. The method of claim 17, comprising:
forming a polarizing film on the first surface of the at least one buffer layer in the display area.

19. The method of claim 18, comprising:
forming an insulation member between the circuit film and the polarizing film.

20. The method of claim 18, comprising:
forming a barrier film on the polarizing film in the display area.

* * * * *